(12) United States Patent
Kijima et al.

(10) Patent No.: US 7,573,083 B2
(45) Date of Patent: Aug. 11, 2009

(54) TRANSISTOR TYPE FERROELECTRIC MEMORY AND METHOD OF MANUFACTURING THE SAME

(75) Inventors: Takeshi Kijima, Matsumoto (JP); Akio Konishi, Shiojiri (JP)

(73) Assignee: Seiko Epson Corporation (JP)

( * ) Notice: Subject to any disclaimer, the term of this patent is extended or adjusted under 35 U.S.C. 154(b) by 98 days.

(21) Appl. No.: 11/633,682

(22) Filed: Dec. 4, 2006

(65) Prior Publication Data

US 2007/0126042 A1 Jun. 7, 2007

(30) Foreign Application Priority Data

Dec. 5, 2005 (JP) ............... 2005-350556

(51) Int. Cl.
| | | |
|---|---|---|
| H01L 29/76 | (2006.01) | |
| H01L 29/94 | (2006.01) | |
| H01L 31/062 | (2006.01) | |
| H01L 31/113 | (2006.01) | |
| H01L 31/119 | (2006.01) | |

(52) U.S. Cl. ............... 257/295; 257/192; 257/310; 438/310

(58) Field of Classification Search ............ 257/192, 257/295, 310, 316; 438/310
See application file for complete search history.

(56) References Cited

U.S. PATENT DOCUMENTS

| | | | |
|---|---|---|---|
| 5,196,912 A * | 3/1993 | Matsumoto et al. ......... 257/16 |
| 6,107,656 A * | 8/2000 | Igarashi ................ 257/295 |
| 6,344,662 B1 | 2/2002 | Dimitrakopoulos et al. |
| 6,809,379 B2 | 10/2004 | Kreupl |
| 6,825,506 B2 | 11/2004 | Chau et al. |
| 6,885,030 B2 * | 4/2005 | Onozuka et al. ........... 257/66 |
| 6,894,355 B1 | 5/2005 | Yu et al. |
| 7,176,075 B2 | 2/2007 | Chau et al. |
| 7,180,109 B2 | 2/2007 | Chau et al. |
| 7,262,450 B2 | 8/2007 | Kijima et al. |
| 2004/0113210 A1 | 6/2004 | Chau et al. |
| 2004/0214352 A1 | 10/2004 | Kijima |
| 2005/0271823 A1 | 12/2005 | Kijima |
| 2006/0017080 A1 * | 1/2006 | Tanaka et al. ............ 257/295 |

FOREIGN PATENT DOCUMENTS

| | | |
|---|---|---|
| CN | 1691352 | 11/2005 |
| JP | 10-041477 | 2/1998 |
| JP | 2003-163331 | 6/2003 |
| JP | 2005-100660 | 4/2005 |
| JP | 2006-151785 | 6/2006 |
| KR | 2002-0092434 | 12/2002 |
| KR | 10-2005-0075448 | 7/2005 |

OTHER PUBLICATIONS

Non-Volatile Thin Film Transistors Using Ferroelectric/ITO Structures, E. Tokumitsu, T. Miyasako, M. Senoo; 2004 Fall Meeting, Materials Research Society (2004) pp. 1 to 6.

* cited by examiner

*Primary Examiner*—Phuc T Dang
(74) *Attorney, Agent, or Firm*—Harness, Dickey & Pierce, P.L.C.

(57) ABSTRACT

A transistor type ferroelectric memory including: a substrate; a gate electrode formed above the substrate; a ferroelectric layer formed above the substrate to cover the gate electrode; a source electrode formed above the ferroelectric layer; a drain electrode formed above the ferroelectric layer and apart from the source electrode; and a channel layer formed above the ferroelectric layer and between the source electrode and the drain electrode.

8 Claims, 6 Drawing Sheets

TRANSISTOR TYPE FERROELECTRIC MEMORY AND METHOD OF MANUFACTURING THE SAME

Japanese Patent Application No. 2005-350556, filed on Dec. 5, 2005, is hereby incorporated by reference in its entirety.

BACKGROUND OF THE INVENTION

The present invention relates to a transistor type ferroelectric memory having a novel structure and a method of manufacturing the same.

As the structure of a related-art one-transistor (1T) type ferroelectric random access memory (FeRAM), a metal-ferroelectric-semiconductor (MFS) structure, a metal-ferroelectric-insulator-semiconductor (MFIS) structure, and a metal-ferroelectric-metal-insulator-semiconductor (MFMIS) structure have been known. However, FeRAMs having any of these structures have many problems.

In the MFS structure, since the surface of a group-IV semiconductor substrate formed of silicon or germanium is easily oxidized, it is very difficult to form an oxide ferroelectric layer on the surface of the substrate. This prevents the MFS structure from being put into practical use. Specifically, when forming the oxide ferroelectric layer on the group-IV semiconductor (e.g. silicon) layer, undesirable film such as a silicon oxide film is formed at the interface between the silicon layer and the oxide ferroelectric layer. Since such a film has a low relative dielectric constant, the operating voltage for causing the polarization reversal of the oxide ferroelectric must be increased. Moreover, since electric charges are injected into the film due to occurrence of a trap level in the film, electric charges due to remanent polarization are defeated, whereby a sufficient polarization reversal does not occur.

The MFIS structure suffers from a problem similar to that of the MFS structure since a silicon oxide layer is generally used as the insulating layer (I layer). Specifically, since silicon oxide has a low relative dielectric constant, the operating voltage for causing the polarization reversal of the oxide ferroelectric must be increased. Moreover, since electric charges are injected into the silicon oxide film due to occurrence of a trap level in the silicon oxide layer, electric charges due to remanent polarization are defeated, whereby a sufficient polarization reversal does not occur. Moreover, since the silicon oxide layer used as the I layer is amorphous, it is very difficult to form an oxide ferroelectric having a crystal structure on the silicon oxide layer.

The MFMIS structure has an advantage over the MFIS structure in terms of formation of the oxide ferroelectric layer, since a metal layer such as a platinum layer having a relatively good affinity to the oxide ferroelectric with respect to crystallinity is formed on the I layer. However, the MFMIS structure suffers from a problem similar to that of the MFIS structure due to the presence of the I layer.

The MFIS structure and the MFMIS structure having the I layer have the following problem as a nonvolatile memory. In the MFIS structure and the MFMIS structure, the oxide ferroelectric layer (F layer) and the I layer (insulating layer) are capacitively coupled. Therefore, when writing data into the F layer by applying a voltage, the applied voltage is distributed to the I layer and the F layer corresponding to the relative dielectric constant and the thickness of each layer, and electric charges are stored corresponding to the applied voltage. The polarization direction of the stored electric charges is the same as the applied voltage direction in the I layer and the F layer. However, when retaining data without applying a voltage, the metal layer (M layer) and the semiconductor layer (S layer) are short-circuited. In this case, since the polarization direction of the F layer is fixed by the remanent polarization, electric charges are induced in the I layer in an amount the same as that of the ferroelectric capacitor formed by the F layer, and the polarization direction of the electric charges is the reverse of that of the ferroelectric capacitor. Therefore, a large depolarization field is applied to the ferroelectric capacitor from the capacitor formed by the I layer. As a result, the polarization direction of the F layer is reversed, whereby the stored data is lost.

SUMMARY

According to a first aspect of the invention, there is provided a transistor type ferroelectric memory comprising:
 a source electrode;
 a drain electrode formed apart from the source electrode;
 a channel layer formed between the source electrode and the drain electrode;
 a ferroelectric layer formed in contact with the source electrode, the drain electrode, and the channel layer; and
 a gate electrode formed opposite to the source electrode, the drain electrode, and the channel layer with the ferroelectric layer interposed in between.

According to a second aspect of the invention, there is provided a transistor type ferroelectric memory comprising:
 a substrate;
 a gate electrode formed above the substrate;
 a ferroelectric layer formed above the substrate to cover the gate electrode;
 a source electrode formed above the ferroelectric layer;
 a drain electrode formed above the ferroelectric layer and apart from the source electrode; and
 a channel layer formed above the ferroelectric layer and between the source electrode and the drain electrode.

According to a third aspect of the invention, there is provided a transistor type ferroelectric memory comprising:
 a substrate;
 a source electrode formed above the substrate;
 a drain electrode formed above the substrate and apart from the source electrode;
 a channel layer formed between the source electrode and the drain electrode;
 a ferroelectric layer formed above the source electrode, the drain electrode, and the channel layer; and
 a gate electrode formed above the ferroelectric layer.

According to a fourth aspect of the invention, there is provided a method of manufacturing a transistor type ferroelectric memory comprising:
 forming a gate electrode above a substrate;
 forming a ferroelectric layer above the substrate to cover the gate electrode;
 forming a source electrode and a drain electrode above the ferroelectric layer; and
 forming a channel layer above the ferroelectric layer and between the source electrode and the drain electrode.

According to a fifth aspect of the invention, there is provided a method of manufacturing a transistor type ferroelectric memory comprising:
 forming a source electrode and a drain electrode above a substrate;
 forming a channel layer between the source electrode and the drain electrode;
 forming a ferroelectric layer above the source electrode, the drain electrode, and the channel layer; and
 forming a gate electrode above the ferroelectric layer.

DETAILED DESCRIPTION OF THE EMBODIMENT

The invention may provide a transistor type ferroelectric memory having a novel structure and a method of manufacturing the transistor type ferroelectric memory.

According to one embodiment of the invention, there is provided a transistor type ferroelectric memory comprising:
a source electrode;
a drain electrode formed apart from the source electrode;
a channel layer formed between the source electrode and the drain electrode;
a ferroelectric layer formed in contact with the source electrode, the drain electrode, and the channel layer; and
a gate electrode formed opposite to the source electrode, the drain electrode, and the channel layer with the ferroelectric layer interposed in between.

According to one embodiment of the invention, there is provided a transistor type ferroelectric memory comprising:
a substrate;
a gate electrode formed above the substrate;
a ferroelectric layer formed above the substrate to cover the gate electrode;
a source electrode formed above the ferroelectric layer;
a drain electrode formed above the ferroelectric layer and apart from the source electrode; and
a channel layer formed above the ferroelectric layer and between the source electrode and the drain electrode.

According to one embodiment of the invention, there is provided a transistor type ferroelectric memory comprising:
a substrate;
a source electrode formed above the substrate;
a drain electrode formed above the substrate and apart from the source electrode;
a channel layer formed between the source electrode and the drain electrode;
a ferroelectric layer formed above the source electrode, the drain electrode, and the channel layer; and
a gate electrode formed above the ferroelectric layer.

According to the transistor type ferroelectric memories according to the above embodiments, since two current values (first current value and second current value) exist when the voltage applied to the gate electrode is zero, the transistor type ferroelectric memory can exhibit a memory function without destroying stored data during reading by detecting the first current value and the second current value.

In any of the above-described transistor type ferroelectric memories, the channel layer may include an oxide semiconductor.

In any of the above-described transistor type ferroelectric memories, the channel layer may include an oxide semiconductor and a dopant which functions as a donor or a acceptor, a valence of the dopant being different from a valence of a metal element forming the oxide semiconductor.

In any of the above-described transistor type ferroelectric memories, the ferroelectric layer may include $Pb(Zr,Ti,Nb)O_3$.

Any of the above-described transistor type ferroelectric memories may further comprise a protective layer provided above the channel layer.

According to one embodiment of the invention, there is provided a method of manufacturing a transistor type ferroelectric memory comprising:
forming a gate electrode above a substrate;
forming a ferroelectric layer above the substrate to cover the gate electrode;
forming a source electrode and a drain electrode above the ferroelectric layer; and
forming a channel layer above the ferroelectric layer and between the source electrode and the drain electrode.

According to the manufacturing method of the above embodiment, a transistor type ferroelectric memory can be manufactured by a relatively simple process.

The above-described method of manufacturing a transistor type ferroelectric memory may further comprise forming a protective layer above the channel layer.

In the above-described method of manufacturing a transistor type ferroelectric memory, the protective layer may include a silicon oxide layer having a silicon-hydrogen bond.

According to one embodiment of the invention, there is provided a method of manufacturing a transistor type ferroelectric memory comprising:
forming a source electrode and a drain electrode above a substrate;
forming a channel layer between the source electrode and the drain electrode;
forming a ferroelectric layer above the source electrode, the drain electrode, and the channel layer; and
forming a gate electrode above the ferroelectric layer.

Embodiments of the invention will be described in detail below, with respect to the drawings.

Figure 1:
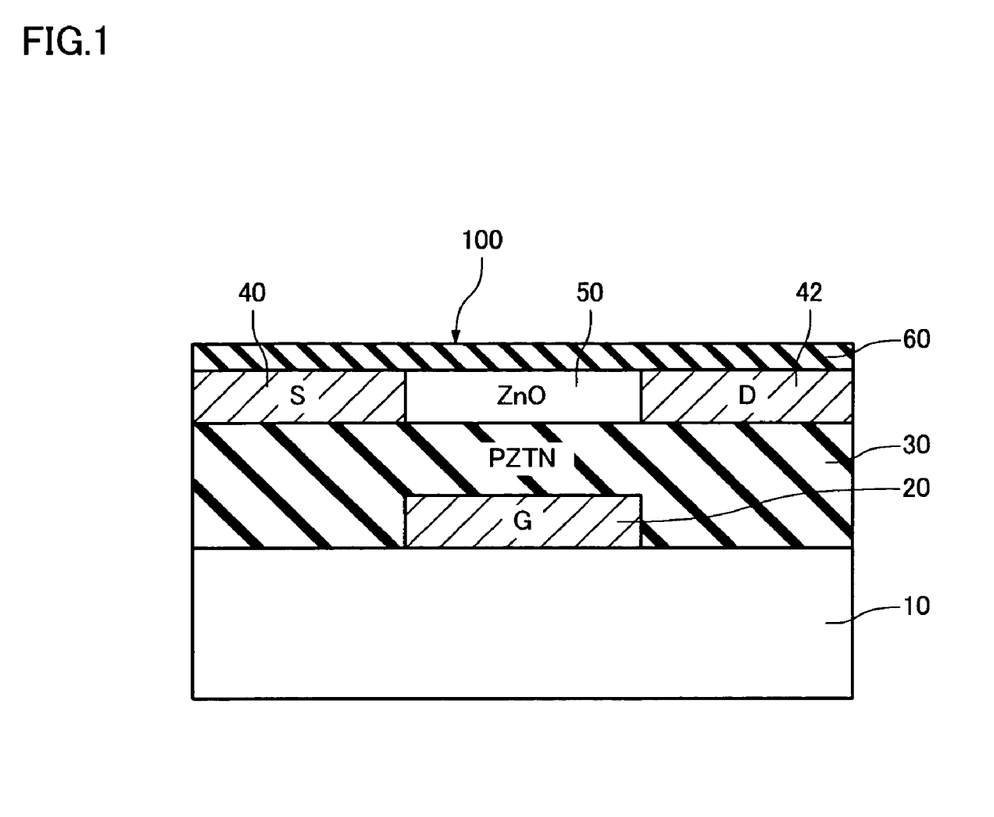
FIG. 1 is a cross-sectional view schematically showing a transistor type ferroelectric memory according to a first embodiment of the invention.

1. First Embodiment 1.1. Transistor Type Ferroelectric Memory According to First Embodiment FIG. 1 is a cross-sectional view schematically showing an example of a transistor type ferroelectric memory according to this embodiment.

A transistor type ferroelectric memory 100 includes a substrate 10, a gate electrode 20 formed on the substrate 10, a ferroelectric layer 30 formed on the gate electrode 20 and the substrate 10, a source electrode 40 and a drain electrode 42 formed on the ferroelectric layer 30, and a channel layer 50 formed on the ferroelectric layer 30. The transistor type ferroelectric memory 100 may optionally include a protective layer 60 on the channel layer 50.

The substrate 10 is not particularly limited and is selected depending on the application of the transistor type ferroelectric memory 100. As the substrate 10, a substrate which exhibits insulating properties or of which at least the surface layer exhibits insulating properties may be used so that the substrate is not electrically connected with the gate electrode 20. As examples of the substrate 10, an insulating substrate formed of glass, quartz glass, plastic, or the like, a multilayer substrate in which an insulating layer such as a silicon oxide layer is formed on a semiconductor layer such as a silicon layer, and the like can be given.

The gate electrode 20 is formed on the substrate 10 in a specific pattern. The gate electrode 20 is formed at a position at which the gate electrode 20 faces at least the channel layer 50. The material for the gate electrode 20 is not particularly limited. The material for the gate electrode 20 is appropriately selected depending on the material and the formation method for the ferroelectric layer 30, for example. As examples of the material for the gate electrode 20, platinum elements such as platinum and iridium, conductive oxides such as $IrO_2$, $InO_2$, and ITO ($InSnO_2$), perovskite conductive oxides such as $LaNiO_3$, and the like can be given.

The ferroelectric layer 30 is formed on the substrate 10 to cover the gate electrode 20. It suffices that the ferroelectric layer 30 have a thickness acceptable in practical application. For example, when causing polarization reversal to occur at a low voltage of 3 V or less, it is preferable that the ferroelectric layer 30 have a thickness of 200 nm or less.

The material for the ferroelectric layer 30 is not particularly limited. As examples of the material for the ferroelectric layer 30, the following materials can be given. Specifically, the ferroelectric of the ferroelectric layer 30 may be formed of a perovskite or bismuth-layer structured oxide shown by $ABO_3$ or $(Bi_2O_2)^{2+}(A_{m-1}B_mO_{3m+1})^{2-}$ (wherein A represents at least one element selected from Li, Na, K, Rb, Pb, Ca, Sr, Ba, Bi, La, and Hf, B represents at least one element selected from Ru, Fe, Ti, Zr, Nb, Ta, V, W, and Mo, and m represents a positive integer of 5 or less) or an oxide with a tungsten bronze structure shown by $A_{0.5}BO_3$ (tetragonal bronze structure) or $A_{0.3}BO_3$ (hexagonal bronze structure) (wherein A represents at least one element selected from Li, Na, K, Rb, Pb, Ca, Sr, Ba, Bi, and La, and B represents at least one element selected from Ru, Fe, Ti, Zr, Nb, Ta, V, W, and Mo). In the example shown in FIG. 1, the ferroelectric layer 30 is formed of PZTN (Pb(ZrTi,Nb)$O_3$).

The source electrode 40 and the drain electrode 42 are formed on the ferroelectric layer 30. The channel layer 50 is formed between the source electrode 40 and the drain electrode 42.

The source electrode 40 and the drain electrode 42 may be formed of a conductive material similar to that of the gate electrode 20.

The channel layer 50 is formed of an oxide semiconductor. As examples of the oxide semiconductor, n-type oxide semiconductors such as ZnO, $TiO_2$, $SnO_2$, CdO, MnO, and FeO and p-type oxide semiconductors such as $CuAlO_2$, NiO, CoO, $Cu_2O$, $MnFe_2O_4$, $NiFe_2O_4$, $In_2O_3$, MnO, and FeO can be given. As other examples of the oxide semiconductor, oxide semiconductors such as $IrO_2$, $InO_2$, and ITO ($InSnO_2$), perovskite oxide semiconductors such as $LaNiO_3$, and the like can be given.

The channel layer 50 may optionally include impurities. For example, the channel layer 50 may include a dopant which differs in valence from the metal element of the oxide semiconductor forming the channel layer 50 and functions as a donor or an acceptor. The carrier mobility can be increased by incorporating such a dopant, whereby the operation speed can be increased.

Specifically, when doping the oxide semiconductor which tends to become an n-type with a metal having a valence greater than that of the metal forming the oxide semiconductor, the metal doped into the oxide semiconductor functions as a donor. For example, when using $TiO_2$ as the oxide semiconductor, Nb or Ta may be used as the donor. When using ZnO as the oxide semiconductor, Al may be used as the donor. When using $BaTiO_3$ as the oxide semiconductor, La or Ta may be used as the donor. When using $SnO_2$ as the oxide semiconductor, Sb may be used as the donor.

On the other hand, when doping the oxide semiconductor which tends to become a p-type with a metal having a valence smaller than that of the metal forming the oxide semiconductor, the metal doped into the oxide semiconductor functions as an acceptor. For example, when using NiO, CoO, FeO, or MnO as the oxide semiconductor, Li may be used as the acceptor. When using $Bi_2O_3$ as the oxide semiconductor, Ba may be used as the acceptor. When using $Cr_2O_3$ as the oxide semiconductor, Mg may be used as the acceptor. When using $LaCrO_3$ as the oxide semiconductor, Sr may be used as the acceptor.

In the example shown in FIG. 1, the channel layer 50 is formed of ZnO. Since the channel layer 50 is an oxide semiconductor, the thickness of the channel layer 50 may be set without taking the relative dielectric constant into consideration, differing from a dielectric. The thickness of the channel layer 50 is preferably 100 nm or less in practical application.

The protective layer 60 is not particularly limited. An oxide film, a nitride film, or the like may be used as the protective layer 60. The protective layer 60 can be provided with a function of controlling the amount of oxygen deficiencies of the channel layer 50 in addition to the function of the protective layer by using a specific material for the protective layer 60. In the example shown in FIG. 1, a silicon oxide layer formed using trimethylsilane as a reaction gas may be used. Since such a silicon oxide layer has a silicon-hydrogen bond, hydrogen is produced when the silicon oxide layer is decomposed by plasma treatment at about 400° C. and reduces the oxide semiconductor or conductive oxide forming the channel layer 50. Therefore, oxygen deficiencies of the channel layer 50 can be controlled. Desired semiconductor properties can be obtained by controlling the oxygen deficiencies of the channel layer 50 to increase the oxygen deficiencies.

The transistor type ferroelectric memory 100 according to this embodiment functions as a nonvolatile memory as described below.

Figure 2:
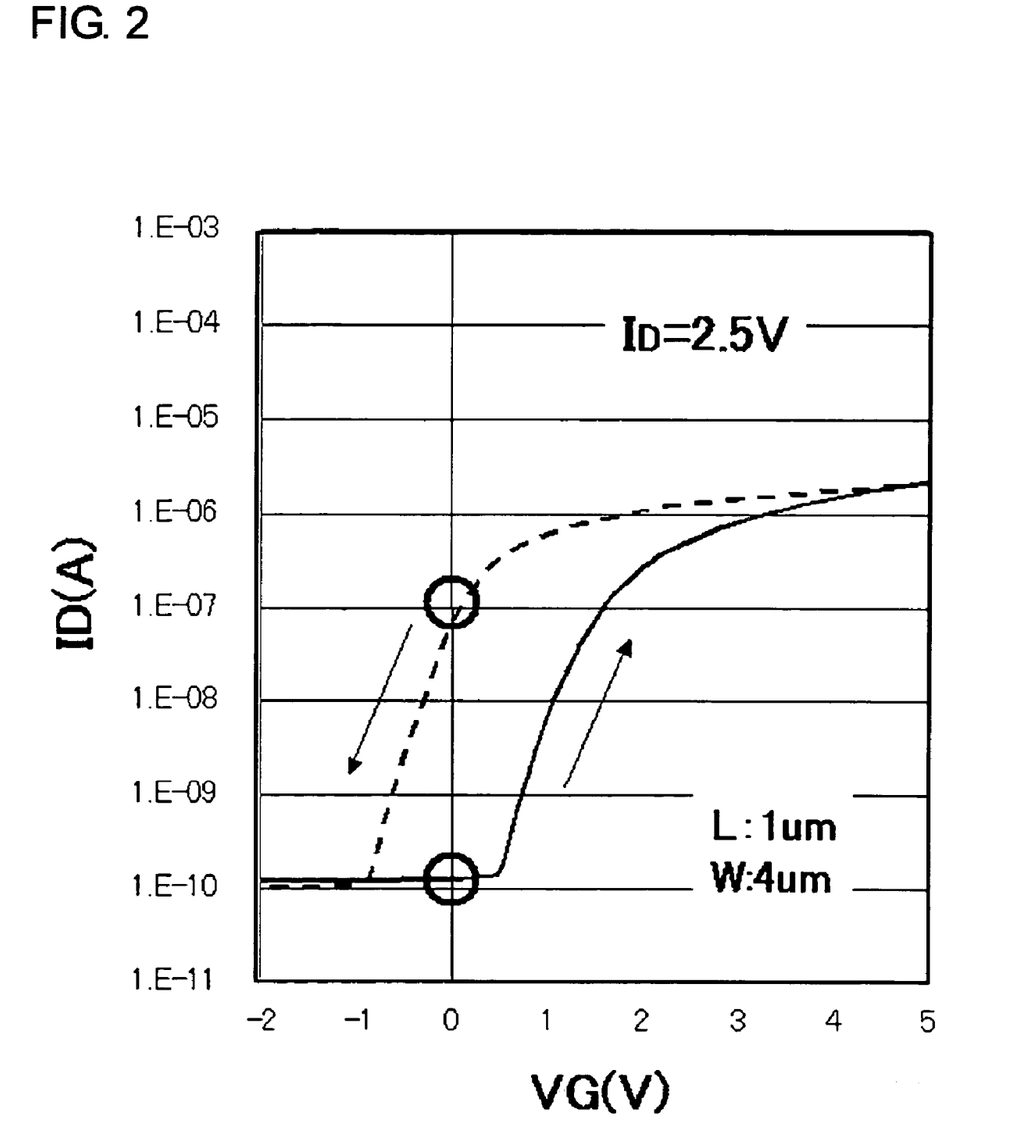
FIG. 2 is a graph showing the current-voltage characteristics of a transistor type ferroelectric memory according to an example of the invention.

As indicated by the current-voltage curves shown in FIG. 2, the transistor type ferroelectric memory 100 has transistor characteristics in which the threshold value differs between the case of changing the direction of the voltage applied to the gate electrode toward the positive side (solid line) and the case of changing the direction of the voltage applied to the gate electrode toward the negative side (broken line). This is because the value of the drain current differs depending on the polarization direction of the ferroelectric layer 30. Specifically, two current values (first current value (OFF value) and second current value (ON value)) exist when the voltage applied to the gate electrode is zero. Therefore, the transistor type ferroelectric memory according to this embodiment can exhibit a memory function without destroying the stored data during reading by detecting the first current value and the second current value, that is, by detecting one current value as "0" and the other current value as "1".

Figure 8:
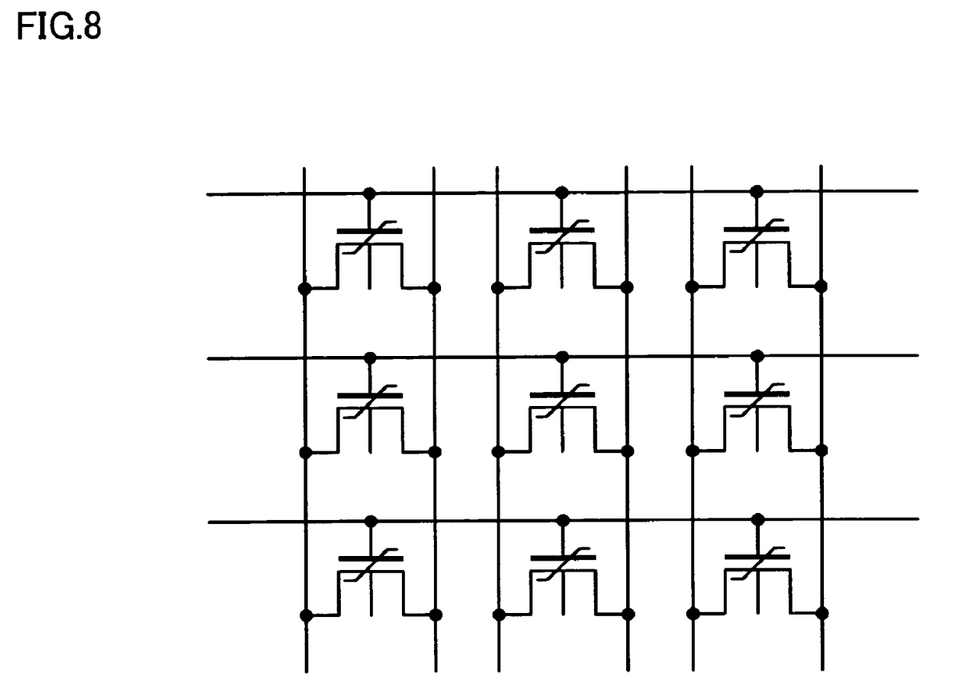
FIG. 8 is an equivalent circuit diagram of a memory array of the transistor type ferroelectric memory according to the first embodiment of the invention.

FIG. 8 shows an equivalent circuit diagram of a memory array including the transistor type ferroelectric memory according to this embodiment.

The transistor type ferroelectric memory 100 according to this embodiment has the following features.

MOS transistor characteristics formed by a silicon process is determined by carrier conductivity (varies as carrier concentration×carrier mobility). Since silicon is a semiconductor in which carriers undergo band conduction, carrier scattering due to an impurity dopant becomes predominant as the carrier density increases, whereby the carrier mobility decreases. On the other hand, an oxide semiconductor is known to exhibit an increased carrier mobility along with an increase in the carrier density. This is an important advantage for improving transistor characteristics.

The band gap of silicon is 1.1 eV. On the other hand, ZnO as an example of the oxide semiconductor has a wide band gap of 3.4 eV so that the OFF current can be reduced when forming a microstructure.

In this embodiment, a ferroelectric material which can induce electric charges in an amount as large as 20 microcoulomb/$cm^2$ or more at a low electric field of about 2 V and can reduce the carrier concentration over a very wide dynamic range is used for the gate oxide film. In the silicon process, a gate oxide film formed of silicon oxide is used. The amount of electric charges stored is determined by the dielectric constant of the silicon oxide film and is a maximum of 3.5 microcoulomb/$cm^2$ (when dielectric breakdown voltage is 10 MV/cm). The amount of electric charges which can be usually used is 1 microcoulomb/$cm^2$, which is about 1/20 of that of the ferroelectric. This means that the ON/OFF ratio of a MOS transistor is significantly improved by using the ferroelectric for the gate oxide film of the transistor in comparison with the case of using silicon.

It is difficult to combine a gate oxide film using a ferroelectric with a silicon semiconductor. Specifically, when directly forming a ferroelectric oxide on silicon, silicon oxide is necessarily formed between the silicon and the ferroelectric. In this case, when the field intensity is low, most of the applied voltage is applied to the silicon oxide film with a low dielectric constant, whereby the polarization of the ferroelectric is not reversed. If the field intensity is increased so that the ferroelectric exhibits a sufficient polarization reversal, the dielectric breakdown voltage of the silicon oxide film is exceeded, whereby the silicon oxide film breaks. In this embodiment, such a problem does not occur since the ferroelectric layer as the gate insulating film and the channel layer formed of the oxide semiconductor are combined, whereby the above-described function can be ensured.

1.2. Method of Manufacturing Transistor Type Ferroelectric Memory According to First Embodiment A method of manufacturing the transistor type ferroelectric memory according to this embodiment may include the following steps. This manufacturing method is described below with reference to FIG. 1.

(1) The gate electrode 20 is formed on the substrate 10.

The materials for the substrate 10 and the gate electrode 20 have been described above. Therefore, further description is omitted. The method of forming the gate electrode 20 is not particularly limited, although the method differs depending on the material. A known method such as a sputtering method, a CVD method, or a laser ablation method may be used. After forming the gate electrode 20, the gate electrode 20 is patterned using a known lithography and etching technology.

(2) The ferroelectric layer 30 is formed on the substrate 10 to cover the gate electrode 20.

The material for the ferroelectric layer 30 is not particularly limited. The above-mentioned material may be used.

As the ferroelectric, PZTN proposed by the inventor of the invention (Japanese Patent Application No. 2003-302900 and Japanese Patent Application No. 2004-380987) may also be suitably used. PZTN is shown by $Pb(Zr,Ti,Nb)O_3$, in which Nb is preferably included at a ratio of 0.05 to 0.3 with respect to Zr and Ti in total. The ferroelectric PZTN may preferably include Si or Si and Ge in an amount of 0.5 to 5 mol %.

The PZTN ferroelectric layer may be obtained by providing a mixed solution of first to third raw material solutions containing at least one of Pb, Zr, Ti, and Nb, and crystallizing oxides contained in the mixed solution by heat treatment or the like, for example. As the first raw material solution, a solution can be given in which a polycondensation product for forming a $PbZrO_3$ perovskite crystal formed by Pb and Zr among the constituent metal elements of the PZTN ferroelectric phase is dissolved in a solvent such as n-butanol in an anhydrous state. As the second raw material solution, a solution can be given in which a polycondensation product for forming a $PbTiO_3$ perovskite crystal formed by Pb and Ti among the constituent metal elements of the PZTN ferroelectric phase is dissolved in a solvent such as n-butanol in an anhydrous state. As the third raw material solution, a solution can be given in which a polycondensation product for forming a $PbNbO_3$ perovskite crystal formed by Pb and Nb among the constituent metal elements of the PZTN ferroelectric phase is dissolved in a solvent such as n-butanol in an anhydrous state.

A capacitor using PZTN as the ferroelectric exhibits excellent hysteresis characteristics and shows only a small amount of leakage current. Therefore, PZTN is useful as the material for the ferroelectric according to this embodiment.

The ferroelectric layer 30 may be formed using a known method such as a sol-gel method, a CVD method, a sputtering method, or liquid source misted chemical deposition (LSMCD).

The upper surface of the ferroelectric layer 30 may optionally be planarized using a chemical mechanical polishing (CMP) method or the like.

(3) The source electrode 40 and the drain electrode 42 are formed on the ferroelectric layer 30.

The method of forming the source electrode 40 and the drain electrode 42 differs depending on the material. The source electrode 40 and the drain electrode 42 may be formed using a known method such as a CVD method, a sputtering method, or a laser ablation method. After forming the source electrode 40 and the drain electrode 42, the source electrode 40 and the drain electrode 42 are patterned using a known lithography and etching technology. The source electrode 40 and the drain electrode 42 may also be formed using a deposition method utilizing a focused ion beam (FIB), for example.

(4) The channel layer 50 is formed between the source electrode 40 and the drain electrode 42.

The material for the channel layer 50 has been described above. Therefore, further description is omitted. The method of forming the channel layer 50 is not particularly limited. For example, the channel layer 50 may be formed using a lift-off method or a polishing method. When using a lift-off method, a resist layer (not shown) is formed on the source electrode 40 and the drain electrode 42, and a layer for the channel layer 50 is then formed. The channel layer 50 is formed between the source electrode 40 and the drain electrode 42 by removing the resist layer. When using a polishing method, a layer for the channel layer 50 is formed, and the source electrode 40 and the drain electrode 42 are then exposed using a polishing method such as a CMP method. The channel layer 50 may also be formed using a method which supplies a raw material for the channel layer between the source electrode 40 and the drain electrode 42 utilizing a droplet discharge method (inkjet method) or a capillarity phenomenon and oxidizes the raw material layer, or a deposition method utilizing an FIB.

(5) The protective layer 60 (e.g. oxide film or nitride film) is formed on the source electrode 40, the channel layer 50, and the drain electrode 42, as required. The protective layer 60 may be formed using a CVD method or the like.

According to the above-described steps, the transistor type ferroelectric memory 100 can be manufactured by a simple process. In the above-described example, the channel layer 50 is formed after forming the source electrode 40 and the drain electrode 42. Note that the source electrode 40 and the drain electrode 42 may be formed after forming the channel layer 50.

2. Second Embodiment

2.1. Transistor Type Ferroelectric Memory According to Second Embodiment

Figure 3:
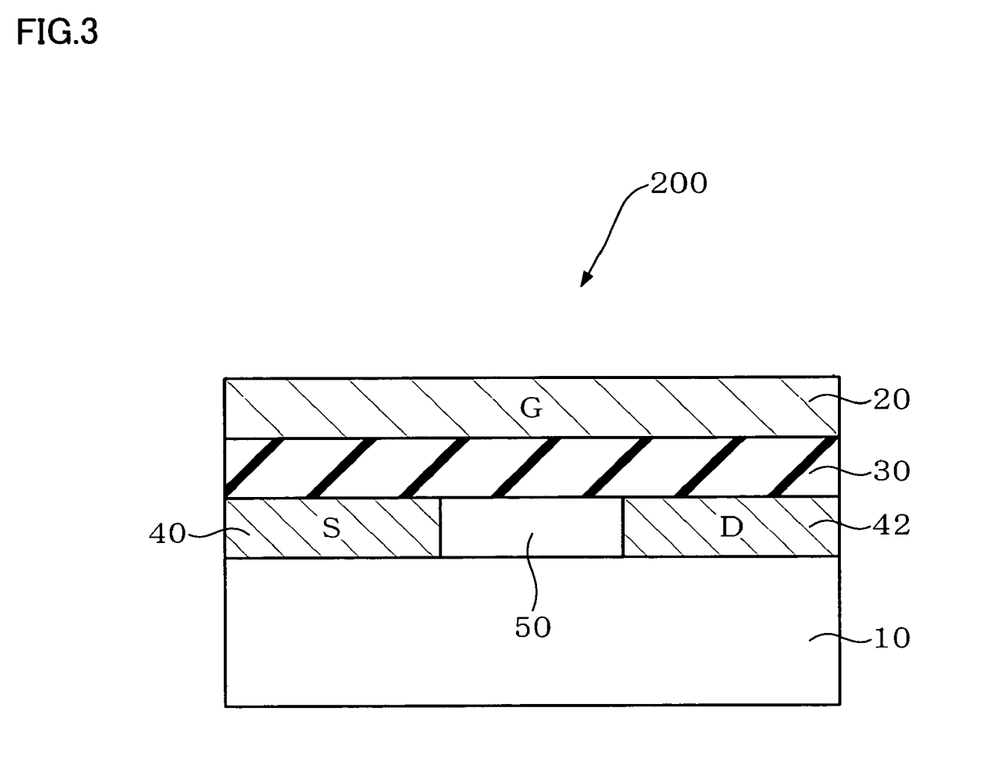
FIG. 3 is a cross-sectional view schematically showing a transistor type ferroelectric memory according to a second embodiment of the invention.

FIG. 3 is a cross-sectional view schematically showing a transistor type ferroelectric memory 200 according to a second embodiment. Sections substantially the same as those of the transistor type ferroelectric memory according to the first embodiment are indicated by the same symbols. Detailed description of these sections is omitted.

The transistor type ferroelectric memory 200 includes the substrate 10, the source electrode 40 formed on the substrate 10, the drain electrode 42 formed apart from the source electrode 40, the channel layer 50 formed between the source electrode 40 and the drain region 42, the ferroelectric layer 30 formed on the source electrode 40, the drain electrode 42, and the channel layer 50, and the gate electrode 20 formed on the ferroelectric layer 30.

The transistor type ferroelectric memory 200 according to this embodiment has an inverse relationship with the transistor type ferroelectric memory 100 according to the first embodiment as to the order of the layers deposited on the substrate 10.

As the materials for the substrate 10, the source electrode 40, the drain electrode 42, the channel layer 50, the ferroelectric layer 30, and the gate electrode 20, materials similar to those described in the first embodiment may be used.

The operation and the features according to this embodiment are similar to those of the transistor type ferroelectric memory 100 according to the first embodiment.

2.2. Method of Manufacturing Transistor Type Ferroelectric Memory According to Second Embodiment A method of manufacturing a memory array including the transistor type ferroelectric memory according to this embodiment may include the following steps. This manufacturing method is described below with reference to FIGS. 4 to 7.

Figure 4:
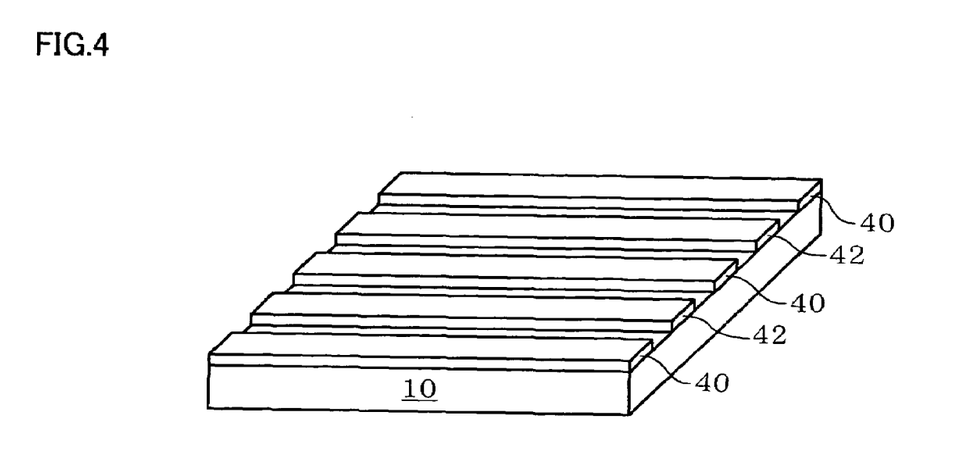
FIG. 4 is a perspective view schematically showing a method of manufacturing the transistor type ferroelectric memory according to the second embodiment of the invention.

(1) The source electrode 40 and the drain electrode 42 are formed on the substrate 10 at a specific interval. The materials for the substrate 10, the source electrode 40, and the drain electrode 42 have been described above. Therefore, further description is omitted. The method of forming the source electrode 40 and the drain electrode 42 is not particularly limited, although the method differs depending on the material. A known method such as a sputtering method, a CVD method, or a laser ablation method may be used. After forming the source electrode 40 and the drain electrode 42, the source electrode 40 and the drain electrode 42 are patterned using a known lithography and etching technology. The source electrode 40 and the drain electrode 42 may also be formed using a deposition method utilizing a focused ion beam (FIB), for example.

Figure 5:
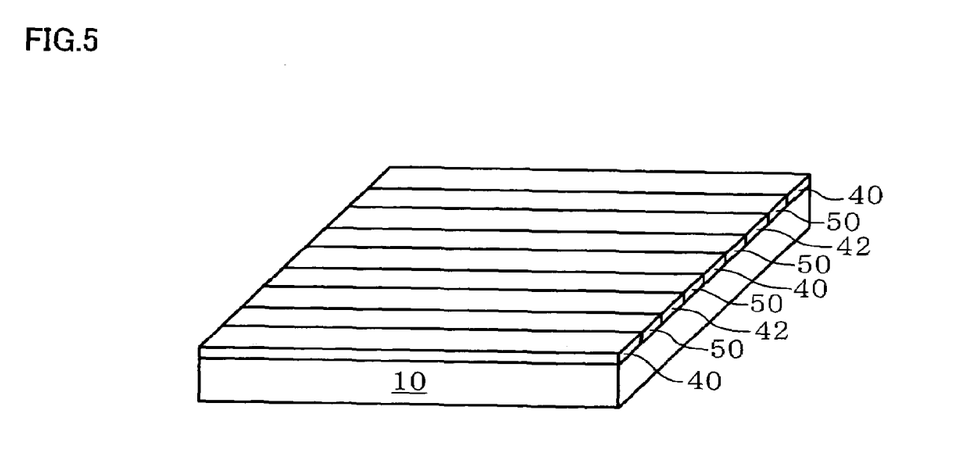
FIG. 5 is a perspective view schematically showing a method of manufacturing the transistor type ferroelectric memory according to the second embodiment of the invention.

(2) The channel layer 50 is formed between the source electrode 40 and the drain electrode 42.

The material for the channel layer 50 has been described above. Therefore, further description is omitted. The method of forming the channel layer 50 is not particularly limited. For example, the channel layer 50 may be formed using a lift-off method or a polishing method in the same manner as in the first embodiment. The channel layer 50 may also be formed using a method which supplies a raw material for the channel layer between the source electrode 40 and the drain electrode 42 utilizing a droplet discharge method (inkjet method) or a capillarity phenomenon and oxidizes the raw material layer, or a deposition method utilizing an FIB.

Figure 6:
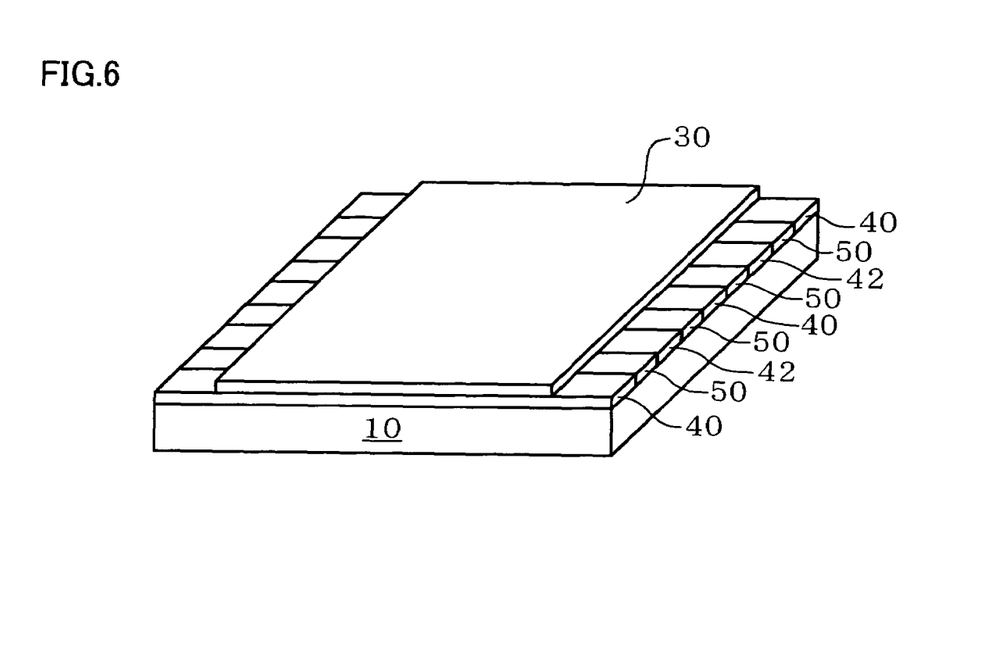
FIG. 6 is a perspective view schematically showing a method of manufacturing the transistor type ferroelectric memory according to the second embodiment of the invention.

(3) The ferroelectric layer 30 is formed on the source electrode 40, the drain electrode 42, and the channel layer 50 to cover the source electrode 40, the drain electrode 42, and the channel layer 50.

The material for the ferroelectric layer 30 is not particularly limited. The above-mentioned material may be used.

The ferroelectric layer 30 may be formed using a known method such as a sol-gel method, a CVD method, a sputtering method, or LSMCD.

The upper surface of the ferroelectric layer 30 may optionally be planarized using a CMP method or the like.

Figure 7:
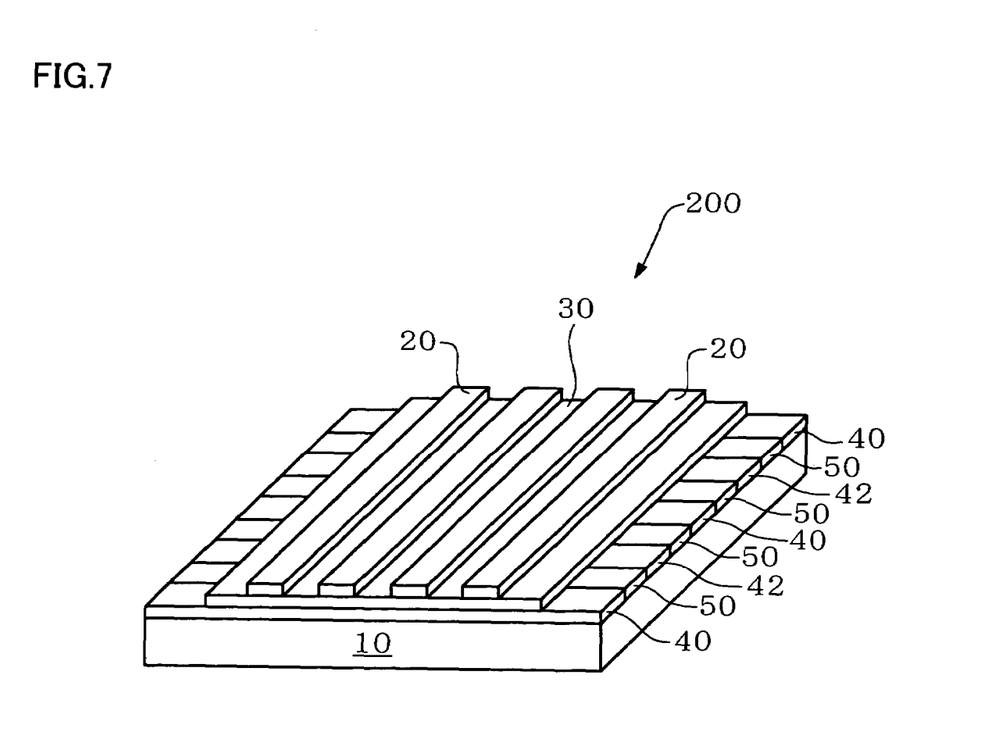
FIG. 7 is a perspective view schematically showing a method of manufacturing the transistor type ferroelectric memory according to the second embodiment of the invention.

(4) The gate electrode 20 is formed on the ferroelectric layer 30.

The method of forming the gate electrode 20 differs depending on the material. The gate electrode 20 may be formed using a known method such as a CVD method, a sputtering method, or a laser ablation method. After forming the gate electrode 20, the gate electrode 20 is patterned using a known lithography and etching technology. The gate electrode 20 may also be formed using a deposition method utilizing an FIB, for example.

(5) The protective layer 60 (e.g. oxide film or nitride film) is formed on the ferroelectric layer 30 and the gate electrode 20, as required. The protective layer 60 may be formed using a CVD method or the like.

According to the above-described steps, the transistor type ferroelectric memory 200 can be manufactured by a simple process.

3. EXAMPLE

In this example, a transistor type ferroelectric memory having the structure shown in FIG. 1 was fabricated.

The gate electrode 20 made of platinum and having a thickness of 100 nm was formed on the substrate (material: silicon substrate on which silicon oxide layer was formed) 10. The gate electrode 20 was formed by depositing a platinum layer by sputtering and then patterning the platinum layer by etching. In this example, the gate length and the gate width of the gate electrode 20 were 1 micrometer and 4 micrometers, respectively.

A ferroelectric layer was formed on the substrate 10 to cover the gate electrode 20. In this example, the ferroelectric layer was formed of $Pb(Zr,Ti,Nb)O_3$. Specifically, a $PbZr_{0.25}Ti_{0.55}Nb_{0.2}O_3$ layer having a thickness of 120 nm was formed at a firing temperature of 650° C. using a $PbZr_{0.25}Ti_{0.55}Nb_{0.2}O_3$ sol-gel solution containing 15% excess Pb.

A platinum layer was deposited by sputtering and then patterned to form the source electrode 40 and the drain electrode 42. The channel layer 50 (ZnO layer) was formed by sputtering between the source electrode 40 and the drain electrode 42.

The current-voltage curve (I-V curve) of the resulting transistor type ferroelectric memory sample was determined. The results are shown in FIG. 2. As shown in FIG. 2, an I-V curve having two current values at a gate voltage of 0 V was obtained due to the hysteresis characteristics of the ferroelectric. Therefore, it was confirmed that the transistor type ferroelectric memory of the example according to the invention exhibits excellent memory characteristics.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A transistor type ferroelectric memory comprising:
    a substrate;
    a gate electrode formed above the substrate;
    a ferroelectric layer formed above the substrate and above the gate electrode;
    a source electrode and a drain electrode formed above the ferroelectric layer; and
    a channel layer formed above the ferroelectric layer, the channel layer being formed between the source electrode and the drain electrode above the ferroelectric layer,
    an upper surface of each of the source electrode, the drain electrode, and the channel layer having one plane, and
    the channel layer contacting the source electrode and the drain electrode.

2. The transistor type ferroelectric memory as defined in claim 1,
    wherein the channel layer includes an oxide semiconductor.

3. The transistor type ferroelectric memory as defined in claim 1,
    the channel layer including an oxide semiconductor and a dopant,
    the dopant having functions as a donor or an acceptor,
    the dopant having a first valence,
    the oxide semiconductor having a second valence,
    the first valence being different from the second valence.

4. The transistor type ferroelectric memory as defined in claim 1,
    the ferroelectric layer including $Pb(Zr,Ti,Nb)O_3$.

5. The transistor type ferroelectric memory as defined in claim 1, further comprising:
    a protective layer formed above the channel layer.

6. A method of manufacturing a transistor type ferroelectric memory comprising:
    forming a gate electrode above a substrate;
    forming a ferroelectric layer above the substrate to cover the gate electrode;
    forming a source electrode and a drain electrode above the ferroelectric layer; and
    forming a channel layer above the ferroelectric layer and between the source electrode and the drain electrode,
    the forming of the channel layer being carried out such that an upper surface of each of the channel layer, the source electrode and the drain electrode and the drain electrode have one plane.

7. The method of manufacturing a transistor type ferroelectric memory as defined in claim 6, further comprising:
    forming a protective layer above the channel layer.

8. The method of manufacturing a transistor type ferroelectric memory as defined in claim 7,
    the protective layer including a silicon oxide layer having a silicon-hydrogen bond.

* * * * *